Figure 1:
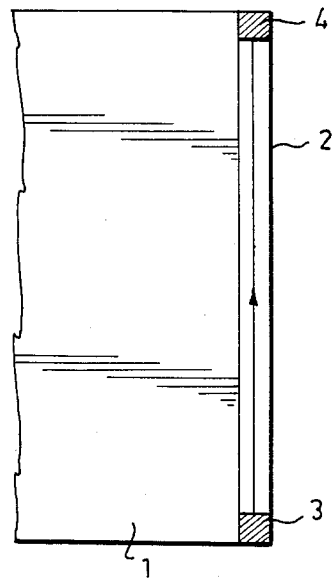

United States Patent [19]

Virtanen

[11] Patent Number: 4,635,032
[45] Date of Patent: Jan. 6, 1987

[54] MOBILE DOOR CLOSURE INTERRUPTING DETECTOR

[76] Inventor: Kalervo M. Virtanen, Metsäpekkalantie 2, 15610 Lahti 61, Finland

[21] Appl. No.: 800,898

[22] Filed: Nov. 22, 1985

Related U.S. Application Data

[63] Continuation of Ser. No. 446,010, Dec. 1, 1982, abandoned.

[30] Foreign Application Priority Data

Jan. 7, 1982 [FI] Finland ................................ 813507
Oct. 27, 1982 [FI] Finland ................................ 823674

[51] Int. Cl.⁴ .......................... B60Q 1/00; B66B 3/00
[52] U.S. Cl. ............................ 304/52 R; 340/19 R; 340/528; 187/29 R; 250/205
[58] Field of Search ............... 340/63, 527, 528, 19 R, 340/661, 662, 52 R; 187/29 R; 250/221, 222.1, 205; 49/27-28

[56] References Cited

U.S. PATENT DOCUMENTS 3,627,082 12/1971 Berkovlts ............................... 49/27
4,069,898 1/1978 Tosato et al. ...................... 187/29 R
4,406,996 9/1983 Oka ....................................... 250/205

FOREIGN PATENT DOCUMENTS 2356961 1/1978 France .................................. 340/551

OTHER PUBLICATIONS

"Digital Feedback Light-Emitting Diode Control"; D. C. Thomas, Jr. and W. O. Tyndall, Jr.; I.B.M. Technical Disclosure Bulletin; vol. 16, No. 8, Jan., 1974; pp. 2598–2600.

Primary Examiner—John W. Caldwell, Sr.
Assistant Examiner—Tyrone Queen
Attorney, Agent, or Firm—Scully, Scott, Murphy & Presser

[57] ABSTRACT

The present invention relates to an alarm device for doors in vehicles which is located in a hollow rubber tube and gives alarm as the tube is compressed. The device can be adjusted to be sensitive by placing in one end of the tube a light transmitter and in the other end a light receiver producing a signal which changes according to the light intensity received by the receiver and by compensating slowly occurring changes in said light intensity so that the light intensity of the light transmitter in a corresponding manner is corrected.

5 Claims, 3 Drawing Figures

MOBILE DOOR CLOSURE INTERRUPTING DETECTOR

This application is a continuation of application Ser. No. 446,010, filed 12/1/82, now abandoned.

The present invention relates to a detecting device for vehicles, comprising a tube having resilient walls, an element arranged within the tube and detecting the compression thereof, and means connected to the detecting element for producing a signal when the compression of the tube exceeds a given limit value.

When closing doors of buses and other common means of transportation dangerous situations arise when persons or objects remain between the closing door and the door frame while the driver is obstructed from seeing the doors. For this reason there has arisen a need to develop devices by means of which a compression produced against the edge of a door in said dangerous situations can be reliably identified and a corresponding alarm given. In order to solve this problem devices have been constructed by means of which the compression or bending of a border rubber at the edges of doors can be measured. Inside the border rubber is arranged, for example, a hose which is filled with pressure air and to the end of which a pressure switch is connected. As the internal pressure in the hose exceeds a set limit value, the switch closes the circuit for an alarm.

A device is also previously known in which a wire is positioned inside the border rubber and a microswitch is connected to one of the ends of said wire. As the border rubber is compressed, the wire is bent whereby the microswitch functions.

Each device suffers from the disadvantage that the smallest compression producing a signal varies according to ambient conditions and the time. In the case of a pressure hose, these variations are due, for example, to temperature variations and a gradual leakage of pressure air from the hose. The length of the wire is in a corresponding manner dependent on the temperature and/or humidity of the air, and the wire is gradually stretched. For these reasons, these known devices can not be made very sensitive but the border rubbers must be considerably compressed before the device gives an alarm. For the same reason, the devices also have a relatively short life. Another disadvantage associated with the wire construction is that it can be used in straight border rubbers only.

The object of the present invention is to provide a detecting device by means of which a sufficiently high sensitivity can be achieved to detect, for example, a compression in the border rubber corresponding to person's caught wrist because its operation is not dependent on the ambient conditions. The invention is characterized in that the detecting element for the compression of the tube comprises a light transmitter and a light receiver between which a light beam passes, and in that electric means are connected to the light receiver, said means after a predetermined time after the start of a change in the light intensity of the light beam received by the receiver produce a correction in the light intensity of the light transmitter compensating this change.

By using a light beam as detecting element and by including in the circuit of the device means which compensate long-term and/or slow changes taking place in the device due to ambient conditions or wear of the device, it is possible to make the device very sensitive because these slow changes need not be taken into account when determining the limit value for the alarm. The device also has a long life because the changes in the properties due to time are compensated by increasing or reducing the light intensity of the light transmitter according to the situation. In addition, it is obvious that the reflection of light from the inner surfaces of the border rubber permits the use of the device also in curved border rubbers. Due to the fact that the device can be adjusted to be very sensitive it has surprisingly been noted that the device, in addition to the above mentioned application, can also be used as a stop-signalling switch in buses whereby the signal is given by compressing the tube with a finger.

The use of a light beam in connection with signalling is known. In the DOS No. 1,945,621 is described a device which activates air cushions and comprises straight and rigid tubes which are fastened to the outer surface of a vehicle and which at their ends are provided with a light receiver and a transmitter and which activate air cushions as they are compressed in a collision because the light connection between the light transmitter and receiver in such a case entirely and finally is broken. It is obvious that the rigidity of the tube prevents the use of this known device as a safety device in doors or as a stop-signalling switch. In time, dust and other corresponding factors may, in addition, weaken the light intensity received by the receiver to such a degree that the air cushions are activated without the tube being compressed.

Figure 2:
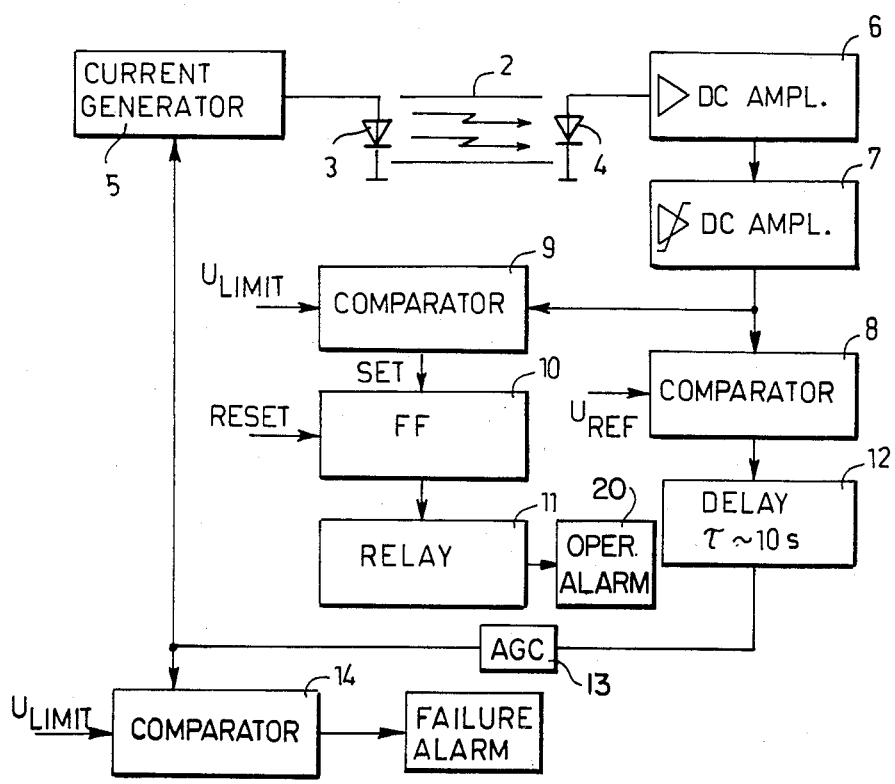
Figure 3:
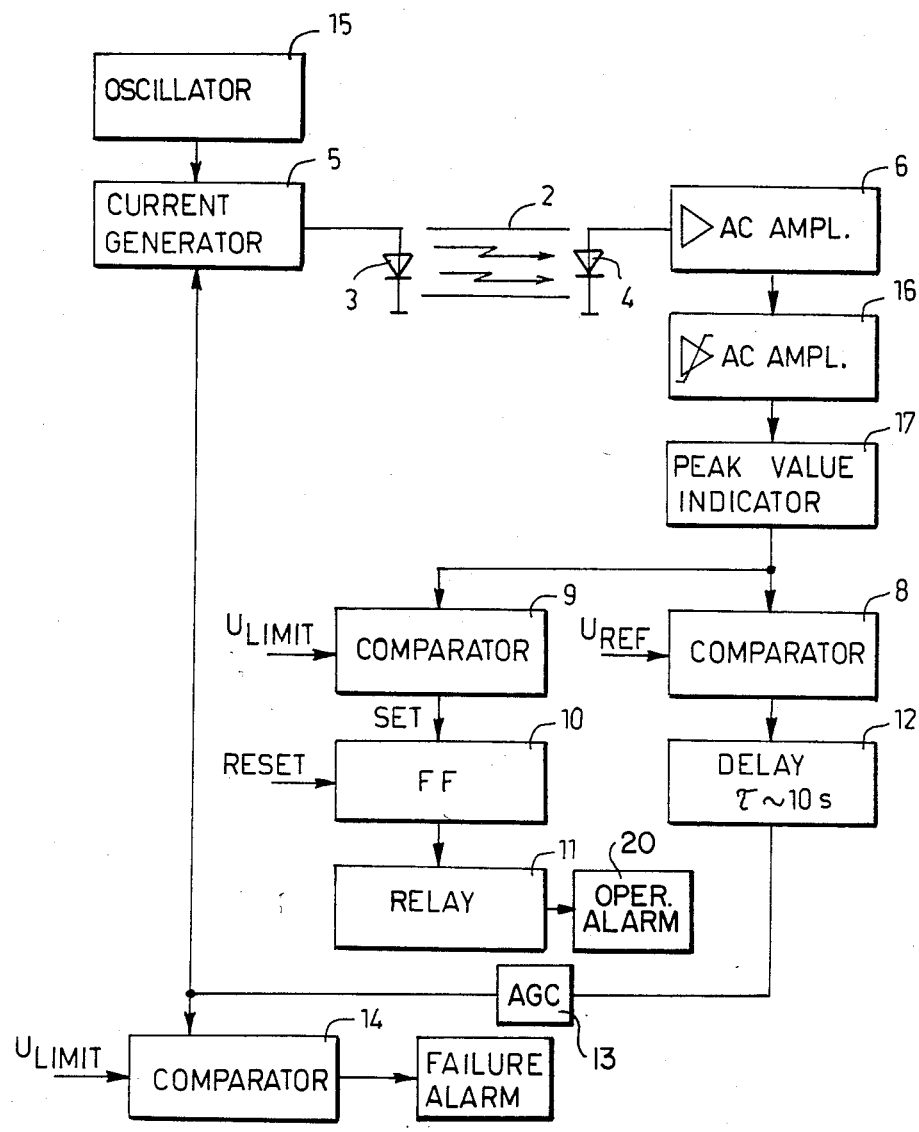

The detecting device according to the invention will be described in the following in more detail with reference to the accompanying drawing, in which FIG. 1 illustrates the operating principle of the device, FIG. 2 is a block diagram of a D.C. coupling of the device, and FIG. 3 is a block diagram of a A.C. coupling of the device.

FIG. 1 shows a door 1 of a vehicle. The vertical edge of the door is provided with a hollow border rubber tube 2 or any other corresponding resilient profile.

The tube may also comprise a profile which in cross-section corresponds to a section of the periphery of a circle and which together with the door edge forms a closed space.

In the lower end of the inner space of the border rubber is arranged a light transmitter 3, such as a bulb, LED or a similar device, and the upper end of the space is provided with a light receiver 4, such as a light diode, transistor, resistor or a similar device.

The light transmitter 3 produces a light beam which passes in the inner space of the border rubber into the light receiver 4.

FIG. 2 illustrates the block diagram of a D.C. coupling of the device. In accordance therewith, a current generator 5 is connected to the transmitter diode 3, while a PIN diode functioning as receiver is connected to a two-stage D.C. amplifier circuit 6 and 7. The output of the latter amplifier 7 is connected to two parallel comparators 8 and 9, of which the comparator 9 compares the signal coming from the amplifier 7 with a limit voltage $U_{limit}$. The comparator 9 is connected to an SR flip-flop 10 which is further connected to a relay 11 which releases an operational alarm 20.

According to the invention, the comparator 8 compares the output of amplifier 7 with a reference voltage $U_{ref}$ which can be any constant voltage. The comparator 8 is connected to a delay circuit 12 which has a delay time of, for example, 10 s and which is connected to the current generator 5 via an automatic gain control (AGC) circuit 13. To said circuit 13 is, moreover, connected a third comparator 14 which compares the signal of the circuit 13 with the limit voltage $U_{limit}$. The comparator is connected to a failure alarm device (not shown).

In operation, the current given by the current generator 5 determines the light intensity of the light transmitter 3. The current given by the diode 4 is amplified in the amplifiers 6, 7 and brought to the comparators 8, 9. The comparator 9 senses sudden changes in this signal exceeding the limit voltage and due to a sudden compression of the tube and sets the flip-flop 10 which further controls the relay 11.

A sudden change in the amplified signal that exceeds the limit voltage $U_{limit}$ will cause the output of the comparator 9 to change states thereby setting the flip-flop 10. The flip-flop 10 energizes the relay 11 which will activate the alarm 20.

If the level of the signal from the amplifier 7 changes so slowly that $U_{limit}$ is not exceeded within the time set in the delay circuit 12, no alarm is produced but the signal is in this case transferred from the delay circuit via the AGC circuit 13 to the current generator which is controlled so that it changes, for example, increases the light intensity of the transmitter 3 until the light intensity received by the receiver 4 is reset to the former level, at which moment the level of the signal received by the comparators 8, 9 is reset to the normal constant level. In this way, the device compensates slow changes which effect the intensity of the light beam and are caused by external factors, due to which the device can be made very sensitive. At the same time, an alarm produced by slow changes which in time may be quite sizeable is prevented.

When the amount of light received by device 4 decreases, the input signal of comparator 8 decreases and this decrease can be noticed by the comparator because of the constant voltage $U_{ref}$ to which the input signal is compared. The purpose of the comparator 8 is, therefore, to notice if and when the output signal of the amplifier 7 decreases. When this happens, the output signal of the comparator 8 decreases which, because of the automatic gain control circuit 13, would normally not affect the input of the current generator 5, because the circuit would compensate the decrease in the signal strength of the output of the comparator 8.

Due to the delay circuit 12 coupled between the comparator 8 and the AGC circuit 13, this compensation is accomplished only if the signal strength of the output signal of amplifier 7 does not decrease to $U_{limit}$ within the time constant of the delay circuit, e.g. within 10 seconds. If the signal strength of the output signal of amplifier 7 decreases to or beyond $U_{limit}$ within the delay time, the alarm connected to relay 11 will be actuated. In this case, the AGC circuit 13 will not compensate for the decrease in the output of comparator 8.

By using such a long delay time as e.g. 10 seconds, the changes in the light intensity can be divided into two groups, whereby sudden changes in the light intensity produce an alarm whereas slow changes, i.e changes in which the $U_{limit}$ has not been reached within the delay time, produce a compensation in the light emitting device 3.

The signal output of the current generator changes in response to the output of the automatic gain control circuit such that when the output of the AGC circuit decreases, the output of the current generator decreases, and when the output of the AGC circuit increases, the output of the current generator increases.

However, if the signal level of the AGC circuit has changed, for example, increased to such an extent that it exceeds the limit voltage set in the comparator 14, a failure alarm is produced because the compensating capability of the device has then been exhausted.

The A.C. coupling shown in FIG. 3 in principle operates in the same manner as the above described D.C. coupling. In this case, however, an oscillator 15 is connected to the current generator 5 so that the transmitter diode 3 is controlled in a pulse-like manner. The D.C. amplifier 6 is replaced by an A.C. amplifier 18. In addition, the second D.C. amplifier 7 is replaced by an A.C. amplifier 16 which separates the background of the pulse-like signal from the D.C. component and after which a peak value indicator 17 is connected for indicating the signal. The peak value indicator is followed by similar comparator, delay and AGC circuits as in the D.C. coupling.

Due to the sensitivity of the above described principle, also other kinds of alarm and signalling devices can be realized, such as, for example, stop-signalling switches in buses and safety border switches in working machines. In this case the profile comprises a long, continuous tube which has resilient walls and inside which a light connection is provided from a transmitter to a receiver and which in the embodiment comprising a signalling switch is fastened on the wall of a bus, for example, in a horizontal position above the row of windows. When the tube is compressed in any location, a change is produced in the light intensity coming to the light receiver which change is interpreted as an ON-/OFF information by means of threshold value comparison.

The light transmission ability of the tube can be improved by providing within it an inner tube or coating which reflects light better than the tube proper.

What I claim is:

1. A signaling device for vehicles comprising:
   a tube having resilient walls;
   a detecting element arranged within said tube for detecting the compression thereof, said detecting element including a light transmitter and a light receiver between which a light beam passes, said light receiver producing an output signal indicative of the intensity of said light beam transmitted through said tube by said light transmitter;
   a first detection circuit means coupled to said light receiver for producing a signal in response to a change in said output signal above a predetermined limit occurring within a predetermined time, said change being caused by a compression of said tube;
   a second detection circuit means coupled to said detecting element for producing a compensating change in the intensity of said light beam emitted by said light transmitter in response to a change in said output signal occurring beyond said predetermined time and an automatic gain control circuit which is coupled between said delay circuit and a current generator coupled to said light transmitter, said automatic gain control circuit producing a correction in the intensity of said light beam of said light transmitter.

2. A signaling device according to claim 1, wherein said delay circuit has a delay time of about 10 s.

3. A signaling device according to claim 1, wherein to said automatic gain control circuit is connected a comparator which compares said signal of said automatic gain control circuit fed to said current generator for said light transmitter with a given limit voltage and an alarm means connected to said comparator for producing a failure alarm when said limit voltage is exceeded.

4. A signaling device according to claim 1, wherein said light transmitter comprises a bulb or an LED and said light receiver comprises a light diode, a light transistor or a light resistor.

5. A signaling device according to claim 1, wherein said tube having an inner surface provided with a light reflecting coating.

* * * * *